United States Patent [19]
Mandl

[11] Patent Number: 4,803,661
[45] Date of Patent: Feb. 7, 1989

[54] LOW POWER EPROM LOGIC CELL AND LOGIC ARRAYS THEREOF

[75] Inventor: William J. Mandl, Canoga Park, Calif.

[73] Assignee: Aerojet-General Corporation, La Jolla, Calif.

[21] Appl. No.: 82,167

[22] Filed: Aug. 6, 1987

[51] Int. Cl.$^4$ .................. G11C 11/34; G11C 7/00
[52] U.S. Cl. ................................ 365/184; 365/189
[58] Field of Search ............ 365/189, 182, 184, 230

[56] References Cited

U.S. PATENT DOCUMENTS 4,527,257  7/1985  Cricchi ................... 365/184
4,611,308  9/1986  Lonky .................... 365/184

Primary Examiner—Terrell W. Fears
Assistant Examiner—Melissa J. Koval
Attorney, Agent, or Firm—Leonard Tachner

[57] ABSTRACT

A plurality of logic cells that may be iteratively connected in the form of an array to form an electrically programmable logic device. Each such cell utilizes a plurality of threshold modifiable CMOS transistors as permanent memory storage devices to provide sixteen possible Boolean logic functions for two input variables. The logical operation of the circuit is controlled by simply changing the programming threshold of the memory transistors. These transistors are buffered by drivers and are provided with a switched load transistor. This substantially reduces memory transistor size and power consumption and permits long term program voltage retention. An 18×9 cell array embodiment is illustrated along with programming and cell selection logic. A 9×9 cell array embodiment is also shown.

10 Claims, 5 Drawing Sheets

LOW POWER EPROM LOGIC CELL AND LOGIC ARRAYS THEREOF

BACKGROUND OF THE INVENTION

1. Field of the Invention

The present invention relates generally to the field of programmable logic devices such as electrically programmable read only memories and more specifically, to a logic element which forms the basic logic cell of a programmable element array wherein the circuit of each such cell employs threshold modifiable transistors as permanent memory storage devices which control the logic operation of the circuit and which may be modified by changing the programming state or threshold of the memory transistors used in the circuit.

2. Prior Art

Conventional electrically programmable read only memories (EPROM) employ a transistor with an alterable switching threshold as a memory device. Such transistors are programmed on or off by threshold change and then scanned by selection electronics to read their contents. This prior art scanning approach requires relatively high bias power consumption in the read electronics and does not apply a holding voltage to the programmed transistor. Consequently, such prior art suffers two distinct disadvantages, namely, high bias power consumption for read out and shorter than desirable program retention time for long term logic applications. As a result, conventional electronically programmed read only memories generally require more complex electronics and therefore, more costly electronics. In addition, they require higher bias power consumption in the read electronics than is generally desirable. There is therefore a current need for an EPROM circuit design which substantially reduces or entirely eliminates high bias power consumption on read electronics as well as providing a means for extending the program retention time of the programmed transistor memory devices.

In a prior art search conducted by the applicant, thirteen patents of varying relevance were found but none reduces the bias power consumption and none provides a sustained programming voltage design to overcome the noted deficiencies of the prior art. These patents consist of the following:

U.S. Pat. No. 4,090,258 Cricchi
U.S. Pat. No. 4,103,185 Denes
U.S. Pat. No. 4,122,544 McElroy
U.S. Pat. No. 4,149,270 Cricchi et al
U.S. Pat. No. 4,170,741 Williams
U.S. Pat. No. 4,192,016 Taylor
U.S. Pat. No. 4,193,128 Brewer
U.S. Pat. No. 4,236,231 Taylor
U.S. Pat. No. 4,399,523 Gerber et al
U.S. Pat. No. 4,446,536 Rodgers
U.S. Pat. No. 4,554,643 Kuo
U.S. Pat. No. 4,575,823 Fitzpatrick
U.S. Pat. No. 4,599,705 Holmberg et al Of the aforementioned thirteen patents, the following are deemed to be the most relevant to the present invention.

U.S. Pat. No. 4,192,016 to Taylor is directed to a CMOS-bipolar EAROM. The memory circuit described in this reference consists of switchable amorphous storage elements, each with an isolation transistor. These isolation transistors are NPN bipolar transistors configured as emitter follows. The circuit uses a clocked operation to reduce the power consumption, and the use of the bipolar NPN transistors reduce the amount of overall area required per cell on the integrated circuit. Thus, this reference describes a buffered switching threshold memory device like the subject disclosure. However, it does not provide the sustaining programming voltage applied to the programmed transistors, as is the case in the subject disclosure, nor is the circuit configuration the same as the subject disclosure.

U.S. Pat. No. 4,599,705 to Holmberg et al is directed to a programmable cell for use in programmable electronic arrays. The reference describes a memory cell for use in programmable logic arrays like the subject disclosure. A switching threshold memory device is used with an isolating device such as a bipolar or MOS type device. Although each memory cell has an isolation device such is not used to eliminate the bias power consumed in the electronics, as is the case of the subject disclosure. Nor does the referenced circuit have a sustaining programming voltage applied to the programmed transistors as does the circuit of the subject disclosure.

U.S. Pat. No. 4,193,128 to Brewer is directed to a high density memory with non-volatile storage array. This reference describes a memory device which incorporates both volatile and non-volatile memory cells. The non-volatile memory cells are made up of a pair of MNOS transistors which store information in accordance with the state of their threshold voltage. These memory cells do not include any buffering, as is the case of the subject disclosure, nor do they provide a sustaining programming voltage to the programmed transistors.

U.S. Pat. No. 4,554,643 to Kuo is directed to an electrically erasable programmable MNOS read only memory. An EPROM memory cell is described where the cell is composed of two transistor elements. The storage element is an MNOS transistor which is the alterable switching threshold device, and coupled in series is an MOS transistor to provide isolation and the needed drive during the read cycle. The buffered read cycle does not reduce the bias power consumption, as is the case of the subject disclosure, nor is programming voltage sustained as is the case of the subject disclosure.

U.S. Pat. No. 4,575,823 to Fitzpatrick is directed to an electrically alterable non-volatile memory. Two variable threshold transistors make up the memory cell of the device described in this reference. While buffer circuits are provided for the device, they are not included in each memory cell, as is the case of the subject disclosure. The sustained programming voltage is also not present in this reference.

SUMMARY OF THE INVENTION

The present invention substantially reduces or entirely overcomes the aforementioned deficiencies of the prior art by providing a novel logic element or cell. This element may be configured as a programmable element array (PEA) to provide a field programmable logic system. The logic element circuit includes a plurality of sections each of which employs a threshold modifiable transistor as a permanent memory storage device. The logic operation of the circuit is controlled and modified by changing the programming state or threshold of the memory transistors used in the circuit. The programmable memory transistor is buffered by drive electronics which reduce or eliminate the aforementioned bias power consumption in the read electronics. In addition, a sustaining programming voltage is applied to the program transistors thereby extending their program retention time.

The detailed description of the invention to follow herein discloses specific programmable element arrays in which the present invention may be used. It will be understood that the invention relates both to the novel improvements within the individual logic circuit elements which may be configured in virtually any array geometry depending upon the numbers of inputs, outputs and control logic elements contained therein, as well as to such arrays of such elements. Furthermore, although a specific embodiment of the novel logic element circuit of the present invention is disclosed herein, such disclosure is being made by way of illustration only, it being understood that the invention herein relates to the general concepts disclosed and is not limited to the specific illustrated embodiments of the circuit element per se nor to the illustrated arrays of such circuit elements.

OBJECTS OF THE INVENTION

It is therefore a principal object of the present invention to provide an improved logic element circuit which may be advantageously configured in the form of a programmable read only memory and which substantially reduces or overcomes the noted deficiencies of the prior art.

It is an additional object of the present invention to provide an improved logic element circuit configuration particularly suited for use in an array geometry to provide a programmable read only memory in which each such circuit element utilizes a programmed transistor buffered by drive electronics to reduce or entirely eliminate bias power consumption otherwise required in the read electronics.

It is still an additional object of the present invention to provide an improved logic element circuit particularly adapted for use in geometric arrays as programmable read only memories of the type which employ a transistor with an alterable switching threshold as a memory device and which utilizes a sustained programming voltage applied to such programmed transistors for extending their program retention time.

It is still an additional object of the present invention to provide a novel logical element circuit which may be used to configure a programmable element array which obviates any substantial bias power consumption in the read electronics and which substantially extends the program retention time thereby reducing power consumption and simplifying circuit configuration.

BRIEF DESCRIPTION OF THE DRAWINGS

The aforementioned objects and advantages of the present invention as well as additional objects and advantages thereof will be more fully understood hereinafter as a result of a detailed description of preferred embodiments of the invention when taken in conjunction with the following drawings in which.

DETAILED DESCRIPTION OF PREFERRED EMBODIMENTS

Figure 1:
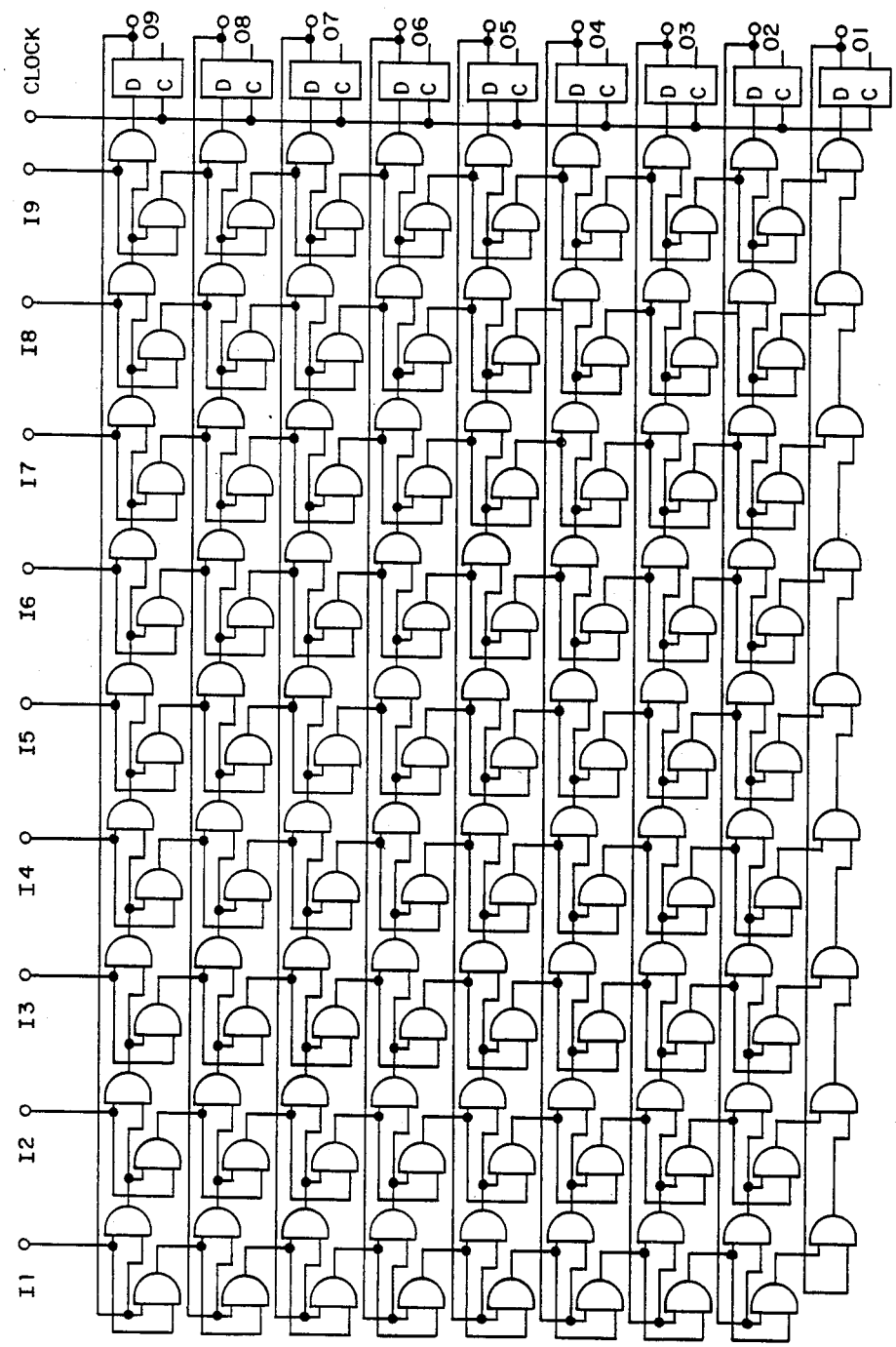
FIG. 1 is a schematic diagram of an illustrative 9×9 programmable element array utilizing the logic element circuits of the present invention.

Referring first to FIG. 1 there is shown therein an array of programmable logic element circuits of the present invention. Each such circuit has two logic inputs and their logic complement inputs. Furthermore, each such circuit has a logical output and its complement output. For the sake of simplicity, the complement inputs and outputs are not shown in FIG. 1. Logically, the output of each circuit is connected to the input terminals of two subsequent circuits. Thus, logical information can flow in both a horizontal and vertical direction as viewed in FIG. 1.

There are nine input signals, identified as I1 through I9, as well as an input clock signal identified by CLOCK. There are also nine output signals identified as O1 through O9. Because of the mannner in which logical information can flow in the circuit of FIG. 1, the inputs I1 through I9 are able to logically affect all of the outputs O1 through O9. Each of the digital logic elements represented by a "gate" symbol in FIG. 1, is identical to all the others and they are linked together in a fixed repetitive grid pattern. These individual elements are each programmable to perform all sixteen possible Boolean logic operations for two input variables.

As shown in FIG. 1, the two inputs to each programmable gate are connected to two other element outputs and the output of each gate is connected to two different elements as inputs. The interconnection between gates are fixed and only the element itself is programmable. By programming the individual circuit elements, that is, by choosing the logical state of each of four programming bits applied to each such element, the logical function of the entire array can be modified for different operations. A specialized version of the circuit elements are shown at the output in flip-flop configurations. This latter programmable structure, shown schematically in FIG. 1a, can be modified to act as either a logical flip-flop, a tri-state driver or a pass through gate depending on the programming.

Figure 1A:
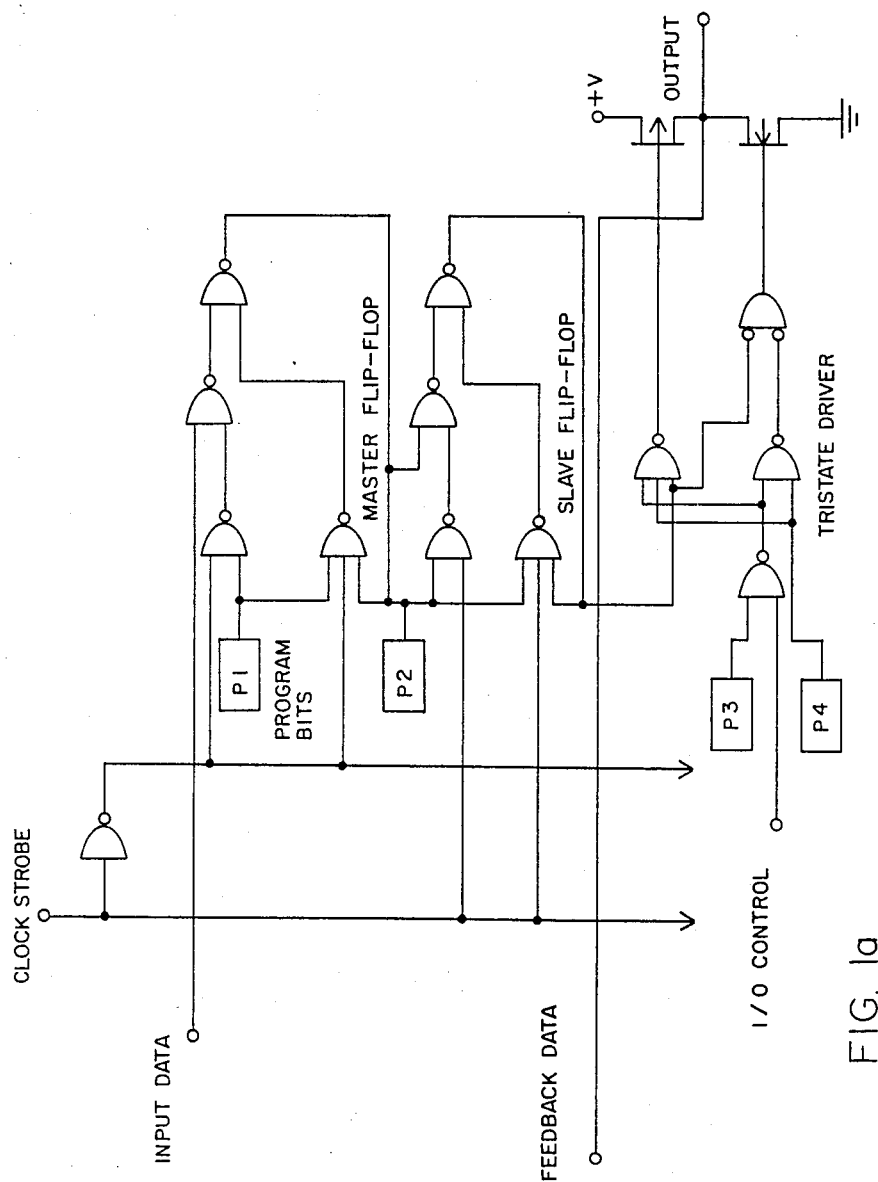
FIG. 1a is a schematic diagram of an output portion of the circuit of FIG. 1.

As seen in FIG. 1a, each such programmable flip-flop is in a master/slave configuration and is provided with programmable circuits P1, P2, P3 and P4 each of which comprises a portion of the circuit of FIG. 2, which will be discussed hereinafter. The logic output of the P1 and P2 programmable circuits determines whether the circuit of FIG. 1a functions as a flip-flop or a pass-through gate, while the logic output of the P3 and P4 programmable circuits, in conjunction with the I/O control, controls the condition of the tri-state driver.

Figure 2:
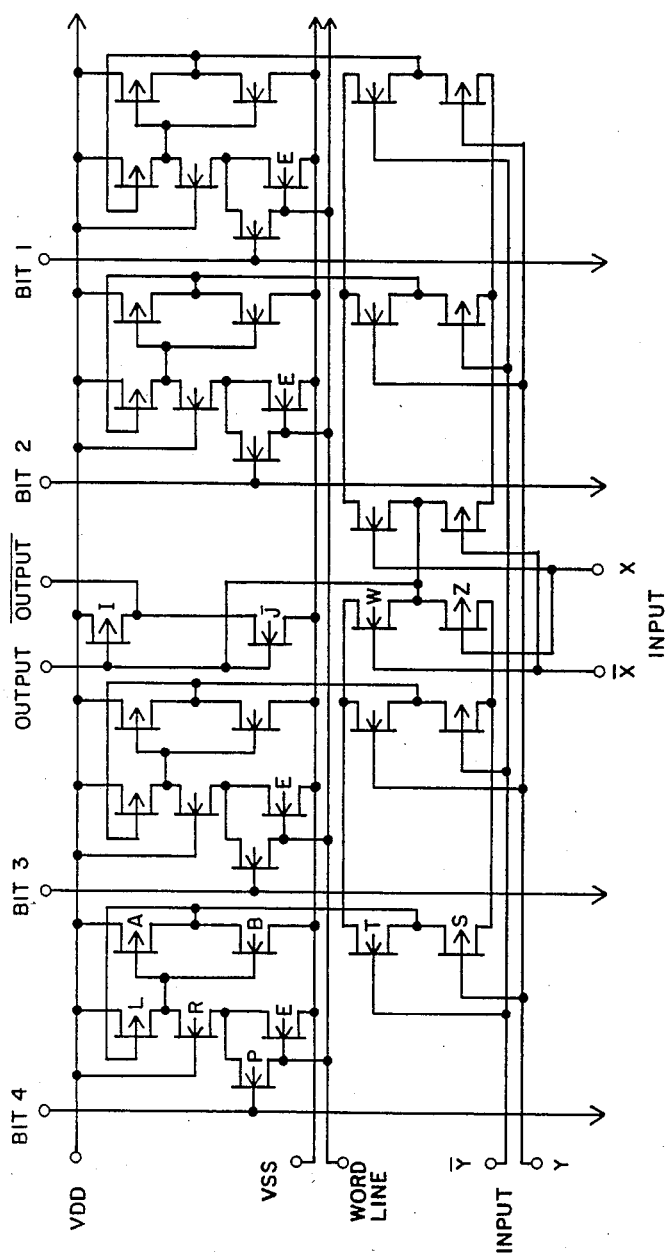
FIG. 2 is a schematic diagram of a programmable element or cell of the present invention.

FIG. 2 is the CMOS circuit schematic of the logic element or gate of FIG. 1. In this particular circuit configuration there are four programmable threshold transistors used to define the function of the circuit element by controlling the ON or OFF state or condition of each such memory transistor. These four threshold programmable transistors allow sixteen possible logic functions to be selected for the circuit. The circuit of FIG. 2 consists of four substantially identical sections, (described as P1, P2, P3 and P4 in regard to FIG. 1a), one for each of the four memory bits that are designed to control the logical state of the circuit element. Each such memory bit section comprises the transistors E, P, R, L, A and B. The E transistor is the threshold programming device for the circuit section. In normal operation the bit lines identified in FIG. 2 as Bit 1, Bit 2, Bit 3 and Bit 4, respectively and the line identified as VSS, are held to 0 potential or ground and a positive voltage is applied to the line identified as VDD as well as to the Word Line. Depending upon the program state of the E transistor, a complementary output driver comprising transistors A and B will be in either a high or low state, that is, either in a logical 1 or logical 0 state. This is, of course, true for each of the four memory bit sections.

The input signals X and Y and their logical complements identified as X and Y, respectively, determine which memory driver transistor A and B will affect the output signal available at the line identified as Output and its complement output. This is accomplished by switching transmission gate transistors T, S, W and Z. There are four possible logic combinations for the two inputs X and Y and depending upon the logic state of the inputs X and Y, one of four possible memory locations is selected for each logic circuit. The E transistor or memory transistor is programmed by raising the Word line and Bit line of the selected transistor to a high positive potential VPP. This applies a positive potential to the gate terminal of transistor P and through transistor P to the source terminal of transistor E. This causes the threshold to shift so that transistor E will no longer change state remains off, when the Word line is set at VDD potential.

The R transistor is a blocking transistor. The voltages applied during programming are higher than VDD. For voltages higher than VDD, the R transistor is off thereby preventing shorting of the word line to the N substrate which is at VDD potential. The P channel transistor L acts as a load for the memory transistor E. In normal operation the L transistor is switched off by the A, B driver when the E transistor is on and conversely the L transistor is switched on when the E transistor is programmed off. Thus, current never flows in the E transistor during normal operation, eliminating all but leakage current power dissipated.

The logic state of the Output terminal thus depends upon two conditions. One such condition is the logic combination of the X and Y inputs which determines which of the A, B drivers of the four sections of the gate circuit of FIG. 2 is selected for the output. This is determined by the effect of the logic state of the X and Y inputs on the transmission gates S, T, W and Z. A second such condition is the programming status of the memory transistor or E transistor of the selected circuit section which is determined by programming applied through the appropriate Bit line and Word line corresponding to that section of the circuit. Accordingly, the transfer function of the circuit of FIG. 2 may be configured by use of appropriate logic selection on bit lines Bit 1 through Bit 4 to perform any one of sixteen Boolean functions so that the logic state of the output of the circuit of FIG. 2 is a function of the logic state of the inputs X and Y in accordance with the functions selected by the bits signals.

Figure 3:
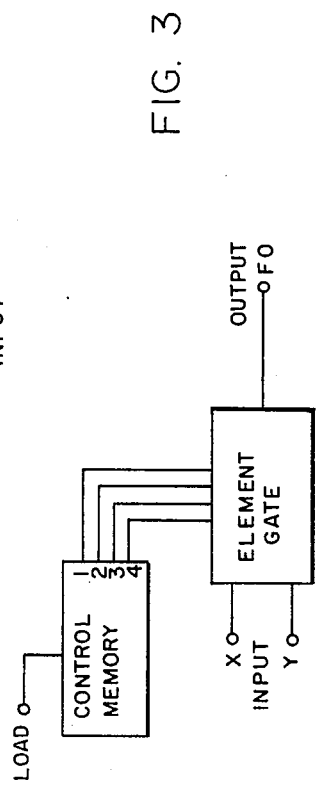
FIG. 3 is a simplified block diagram illustrating the interconnection between the gate portion of the present invention and the control memory portion thereof for configuring the Boolean function of the gate portion.

The sixteen Boolean transfer functions are listed in Table I and the block diagram equivalent of the circuit of FIG. 2 is illustrated in FIG. 3.

TABLE I

| | | | | TRANSFER FUNCTIONS | |
|---|---|---|---|---|---|
| 0 | 0 | 1 | 1 | X | INPUTS |
| 0 | 1 | 0 | 1 | Y | |
| 0 | 0 | 0 | 0 | O | OUTPUT FUNCTIONS |
| 0 | 0 | 0 | 1 | XY | FO |
| 0 | 0 | 1 | 0 | XY | |
| 0 | 0 | 1 | 1 | X | |
| 0 | 1 | 0 | 0 | XY | |
| 0 | 1 | 0 | 1 | Y | |
| 0 | 1 | 1 | 0 | XY + XY | |
| 0 | 1 | 1 | 1 | X + Y | |
| 1 | 0 | 0 | 0 | X + Y | |
| 1 | 0 | 0 | 1 | XY + XY | |
| 1 | 0 | 1 | 0 | Y | |
| 1 | 0 | 1 | 1 | X + Y | |
| 1 | 1 | 0 | 0 | X | |
| 1 | 1 | 0 | 1 | X + Y | |
| 1 | 1 | 1 | 0 | X + Y | |
| 1 | 1 | 1 | 1 | 1 | |
| 1 | 2 | 3 | 4 | | CONTROL MEMORY BITS |

The block diagram of FIG. 3 indicates that the element gate to which variables X and Y are input, may be altered in terms of logic function or transfer function by the condition of the four bits generated by the control memory. Accordingly, the logic state of the output FO is a function of the bit combinations of the control memory output as well as the logic state of the X and Y input signals. In the particular circuit of FIG. 2 the control memory consists of the E, R, L, A, B and P transistors. These transistors form one of the four control memory bits which are programmed to a high or low, 1 or 0, state for determining the logical function of the element gate.

The memory circuit is an important feature of the present invention in that it offers two significant advantages over the prior art. The first such advantage is that the memory transistor E is buffered from the switching logic by the A, B driver and is not scanned or switched during normal operation. This permits the E transistor to be as small as possible without requiring a sense amplifier as is required in conventional scanned approaches. A second important feature is that the load on the E transistor is either on or off. More specifically, the L transistor in each section of the circuit of FIG. 2, constitutes a load for the memory transistor. In normal operation this load is held off by the A and B driver when the E transistor is on and conversely the L transistor is held on when the E transistor is programmed off. Thus, no current other than substrate leakage is drawn by the memory circuit. Consequently, the power consumption utilized in the memory circuit is the lowest possible for CMOS technology.

It will be understood that the circuit of FIG. 2 represents a preferred embodiment of the configuration of the individual cell circuits of FIG. 1 and therefore that each such individual element or cell of FIG. 1 can be programmed in the manner previously described. As a result, it can be seen that a variety of logical systems can be created by programming the individual gates. This characteristic is represented by the block diagram of FIG. 3 in which the control memory represents the circuit sections which include the A, B, E, L, P and R transistors and the element gate represents the circuit sections including the S, T, W and Z transistors.

Figure 4:
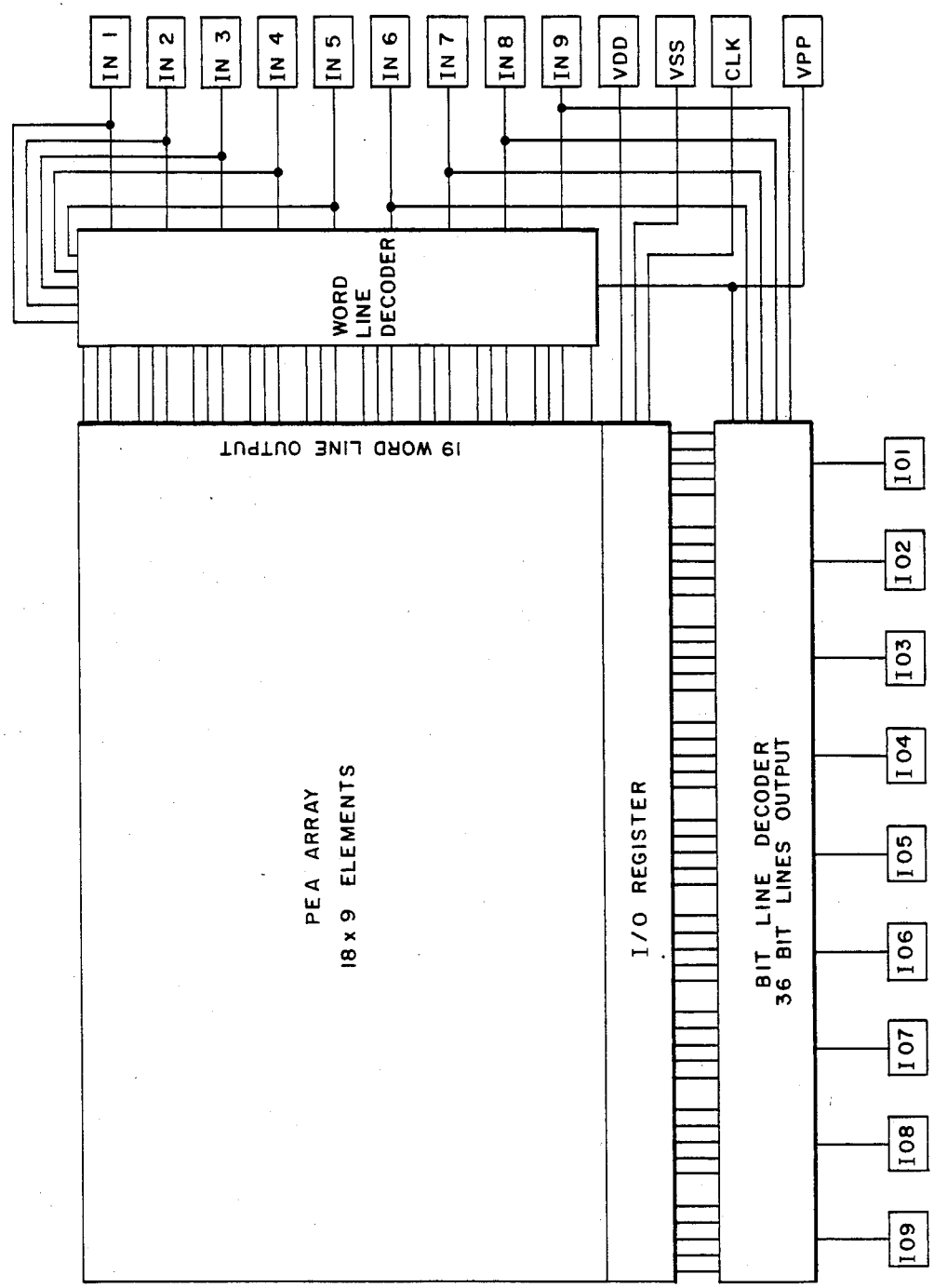
FIG. 4 is a block diagram of a system in which the present invention may be configured for input, output and programming control of a programmable element array comprising a matrix of 18×9 elements.

Referring now to FIG. 4, what is shown therein comprises the block diagram of a system of gates of the aforementioned novel configuration of the present invention. More specifically, there is shown an array of 162 such elements in an 18×9 element configuration. Furthermore, illustrated in FIG. 4 are the decode logic devices showing the relationship of the decode logic for Word line and Bit line control. The Word line and Bit line programming of each of the memory transistors of the respective sections of the respective gates, is derived from special logic sharing the input and output lines of the array as described below in regard to FIG. 5. The decode logic is transparent to the system during normal operation. This circuitry is only activated when the programming voltage VPP is raised above the power voltage VDD during a programming mode. Consequently, programming and logic pins can be shared to conserve input and output lines and thereby reduce the complexity and surface area of the present invention. Input data (not programming signals) is provided on terminals IN1-IN9 and on IO1-IO9. Output data is provided on IO1-IO9 on a timeshared basis using the I/O register for temporary storage.

Figure 5:
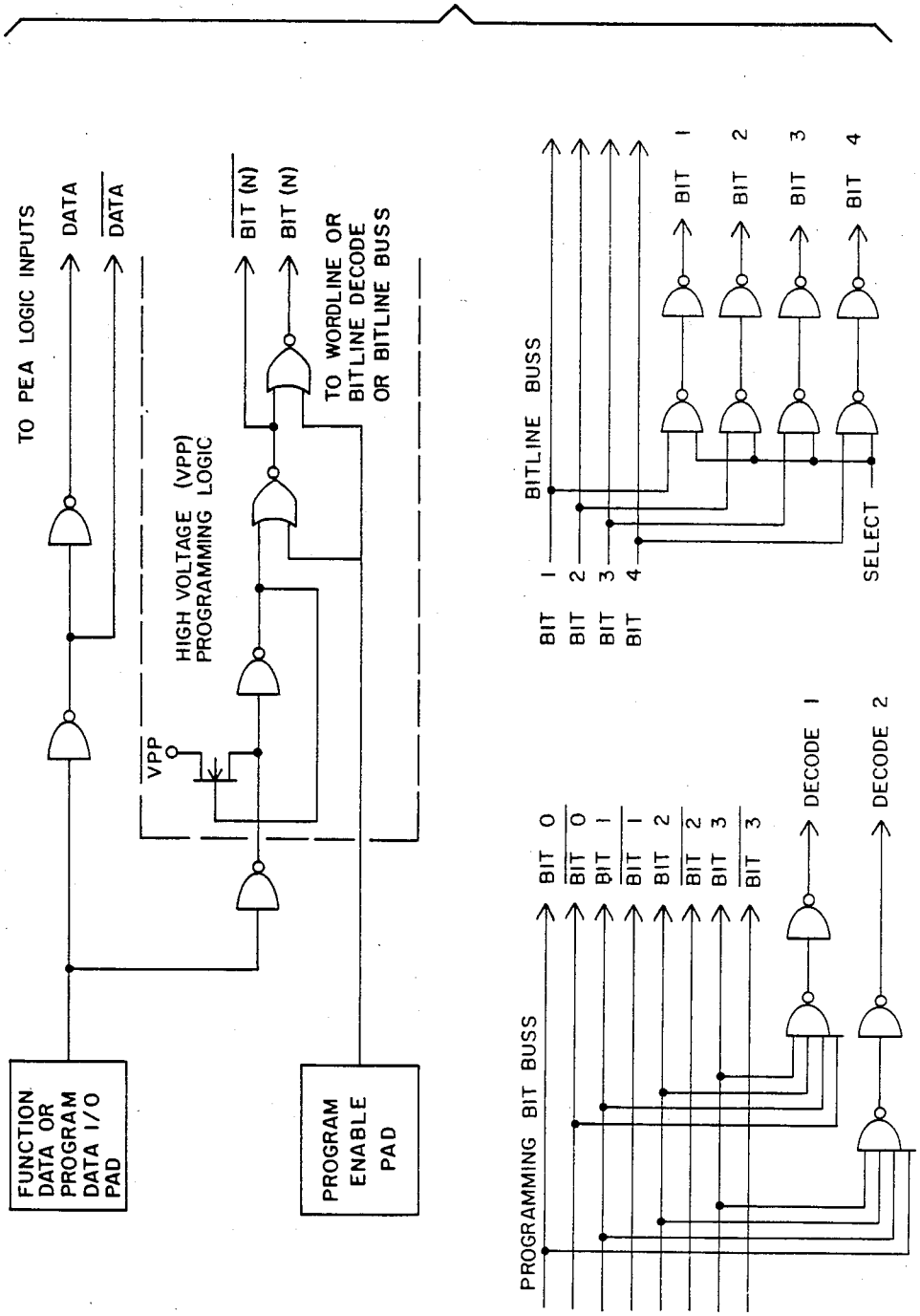
FIG. 5 provides logic diagrams illustrating the programming logic used in the system of FIG. 4.

FIG. 5 illustrates the nature of the logic circuits used to shift from the normal logic voltage levels, e.g., +5 volts, to the programming voltage levels, e.g., +12 volts, and to address the selected Word and Bit lines for programming the PEA logic circuits in the array of FIG. 4. The upper circuit of FIG. 5 is typical of the logic used to raise the signals on Bit lines and Word lines to the Vpp level from the nominal voltage levels for programming the array elements. The Program Enable Pad output controls this voltage level through the gate structure within the dotted line portion of the upper circuit. The lower left-hand circuit of FIG. 5 represents a typical decode circuit for generating the appropriate Bit line and Word line address signals for selecting the chosen PEA logic circuits during programming and the lower right-hand circuit illustrates typical select logic for appropriate Bit line selection in response to the output of the left-hand circuit of FIG. 5.

It will now be understood that what has been disclosed herein comprises a novel low power usage PROM logic cell and logic array employing a plurality of such cells. Each such cell utilizes a plurality of threshold modifiable CMOS transistors as permanent memory storage devices to provide sixteen possible Boolean logic functions for two input variables. The logic operation of the circuit is controlled by applying a program threshold voltage of the memory transistors. Each such memory transistor is buffered by drivers and is provided with a switched load transistor. As a result, each such cell uses smaller memory transistors, less power and permits long term program voltage retention. A plurality of such cells arranged in a matrix array with each cell programmable, may be configured as an EPROM that is extremely low power and entirely versatile. Illustrative examples of 9×9 and 18×9 arrays, the latter also illustrating programming logic circuitry, have also been disclosed.

Those having skill in the relevant art, will now, as a result of the applicant's teaching herein, perceive various modifications and additions which may be made to the invention. By way of example, while the circuits disclosed utilize CMOS technology, other semiconductor technology may also be suitable for implementing the cell and arrays of the present invention. In addition, other advantageous plural configurations of the cell of the present invention will now occur. However, all such modifications and additions are deemed to be within the scope of the invention which is to be limited only by the appended claims.

I claim:
1. A programmable logic cell comprising:
    a plurality of circuit sections each having a threshold alterable transistor;
    a plurality of bit lines, at least one such bit line respectively connected to each said circuit section for altering the programming threshold of said transistor;
    a plurality of input lines connected to said cell for receiving input logic signals;
    at least one output line connected to said cell for transferring an output logic signal from said cell; and
    a plurality of driver transistors including at least one driver transistor associated with each threshold alterable transistor, each such driver transistor providing the output signals to said output line and being connected for buffering said threshold alterable transistor thereby reducing the current handling requirement of said threshold alterable transistor;
    the respective programming thresholds of said alterable transistors determining the Boolean logic function of said logic cell, the logic state of said output logic signal being dependent on said cell Boolean logic function and the logic states of said input logic signals, the logic cell having all possible Boolean logic functions for the number of said input signals.

2. The logic cell recited in claim 1 wherein each of said transistors is a CMOS field effect transistor.

3. The logic cell recited in claim 1 wherein there are four of said circuit sections, four of said bit lines, two of said input lines and sixteen Boolean logic functions.

4. The logic cell recited in claim 1 further comprising a plurality of switchable load transistors, at least one such switchable load transistor being connected to each of said threshold alterable transistors for isolating said threshold alterable transistor when it is on and for removing isolation from said threshold alterable transistor when it is off thereby reducing average power consumption of said circuit section.

5. A programmable logic cell comprising:
    a plurality of circuit sections each having a threshold alterable transistor;
    a plurality of bit lines, at least one such bit line respectively connected to each said circuit section for altering the programming threshold of said transistor;
    at least one word line connected to each of said circuit sections for altering the programming threshold of each said transistor;
    a plurality of input lines connected to said cell for receiving input logic signals;
    at least one output line connected to said cell for transferring an output logic signal from said cell, the logic state of said output logic signal being dependent upon the logic state of said input signals and the Boolean logic function of said cell which is determined by the respective programming thresholds of said transistors; and
    a plurality of switchable load transistors, at least one such switchable load transistor being connected to each of said threshold alterable transistors for isolating said threshold alterable transistor when it is on and for removing isolation from said threshold alterable transistor when it is off thereby reducing average power consumption of said circuit section;

the number of selectible Boolean logic functions of said cell being equal to the maximum possible for the number of said input logic signals.

6. The logic cell recited in claim 5 wherein each of said transistors is a CMOS field effect transistor.

7. The logic cell recited in claim 5 wherein there are four of said circuit sections, four of said bit lines, two of said input lines and sixteen Boolean logic functions.

8. A programmable logic cell array comprising a matrix connection of a plurality of logic cells, each such cell comprising:

a plurality of circuit sections each having a threshold alterable transistor;

a plurality of bit lines, at least one such bit line respectively connected to each said circuit section for altering the programming threshold of said transistor;

a plurality of input lines connected to said cell for receiving input logic signals;

at least one output line connected to said cell for transferring an output logic signal from said cell, the logic state of said output logic signal being dependent upon the logic state of said input signals and the Boolean logic function of said logic cell which is set in accordance with the respective programming thresholds of said transistors;

a plurality of driver transistors including at least one driver transistor associated with each threshold alterable transistor, each such driver transistor providing the output signals to said output line and being connected for buffering said threshold alterable transistor thereby reducing the current handling requirement of said threshold alterable transistor; and means for applying address signals to said bit lines for selecting a cell and circuit sections therein for programming and for applying a programming voltage for altering the threshold of the threshold alterable transistors of the selected circuit sections;

said logic cell providing all possible Boolean logic functions for the number of said input logic signals.

9. The logic array recited in claim 8 wherein each of said transistors of said cells is a CMOS field effect transistor.

10. The logic array recited in claim 8 wherein each of said cells comprises four of said circuit sections, four of said bit lines, two of said input lines and sixteen Boolean logic functions.

* * * * *